US012557385B2

(12) United States Patent
Yan et al.

(10) Patent No.: US 12,557,385 B2
(45) Date of Patent: Feb. 17, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhuoran Yan, Beijing (CN); Fengli Ji, Beijing (CN); Zhenli Zhou, Beijing (CN); Yudiao Cheng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 530 days.

(21) Appl. No.: 18/025,628

(22) PCT Filed: Apr. 27, 2022

(86) PCT No.: PCT/CN2022/089450
§ 371 (c)(1),
(2) Date: Mar. 9, 2023

(87) PCT Pub. No.: WO2023/206112
PCT Pub. Date: Nov. 2, 2023

(65) Prior Publication Data
US 2024/0290796 A1   Aug. 29, 2024

(51) Int. Cl.
*H01L 27/12* (2006.01)
*G01R 31/28* (2006.01)
(Continued)

(52) U.S. Cl.
CPC ......... *H10D 86/60* (2025.01); *G01R 31/2884* (2013.01); *G01R 31/2896* (2013.01); *H10D 86/443* (2025.01)

(58) Field of Classification Search
None
See application file for complete search history.

(56) References Cited

U.S. PATENT DOCUMENTS

| 2019/0066556 A1 | 2/2019 | Abe et al. |
| 2020/0152120 A1 | 5/2020 | Li et al. |
| 2021/0134198 A1 | 5/2021 | Ma et al. |

FOREIGN PATENT DOCUMENTS

| CN | 108400101 A | 8/2018 |
| CN | 109461765 A | 3/2019 |

(Continued)

*Primary Examiner* — William C Trapanese
(74) *Attorney, Agent, or Firm* — IPro, PLLC

(57) ABSTRACT

Provided is a display panel, including a substrate provided with a display region and a non-display region; a light-emitting device disposed in the display region; a cell test unit disposed in the non-display region, wherein the cell test unit include thin-film transistors arranged along a first direction; a first power line disposed in the non-display region, wherein the first power line includes a first sub-connecting line and a second sub-connecting line, the first sub-connecting line is disposed between the cell test unit and the display region and is electrically connected to the light-emitting device, one end of the second sub-connecting line is electrically connected to the first sub-connecting line, and the other end of the second sub-connecting line is disposed on a side, distal to the display region, of the cell test unit, and the second sub-connecting line is disposed between adjacent thin-film transistors in the first direction.

20 Claims, 7 Drawing Sheets

(51) Int. Cl.
_H10D 86/40_  (2025.01)
_H10D 86/60_  (2025.01)

(56) References Cited

FOREIGN PATENT DOCUMENTS

| | | | | |
|---|---|---|---|---|
| CN | 110190103 A | * | 8/2019 | ........... H10K 59/124 |
| CN | 112255847 A | | 1/2021 | |
| CN | 113409714 A | | 9/2021 | |

* cited by examiner

DISPLAY PANEL AND DISPLAY DEVICE

This application is a U.S. national stage of international application No. PCT/CN2022/089450, filed on Apr. 27, 2022, entitled "DISPLAY PANEL AND DISPLAY DEVICE", the disclosure of which is herein incorporated by reference in its entirety.

TECHNICAL FIELD

The present disclosure relates to the field of display technologies, in particular to a display panel and a display device.

BACKGROUND

With the development of display technologies, display devices are more and more widely used. Common display devices include smart phones, tablet computers, televisions, displays, and the like. The display devices include display panels for displaying images.

SUMMARY

The embodiments of the present disclosure provide a display panel. The technical solutions are as follows.

According to one aspect of the present disclosure, a display panel is provided. The display panel includes:
  a substrate provided with a display region and a non-display region disposed at a periphery of the display region;
  a light-emitting device disposed in the display region;
  a cell test unit disposed in the non-display region, wherein the cell test unit includes a plurality of thin-film transistors arranged along a first direction;
  a first power line disposed in the non-display region, wherein the first power line includes a first sub-connecting line and a second sub-connecting line, the first sub-connecting line is disposed between the cell test unit and the display region and is electrically connected to the light-emitting device, one end of the second sub-connecting line is electrically connected to the first sub-connecting line, and the other end of the second sub-connecting line is disposed on a side, distal to the display region, of the cell test unit, and the second sub-connecting line is disposed between adjacent thin-film transistors in the first direction.

In some embodiments, the cell test unit further includes a test signal line, the test signal line is electrically connected to the thin-film transistors and is configured to provide a test signal to the thin-film transistors; and
  an orthographic projection of the test signal line onto the substrate is overlapped with an orthographic projection of the second sub-connecting line onto the substrate.

In some embodiments, the display panel further includes a first insulating layer, wherein the test signal line includes a first sub-test signal line and a second sub-test signal line, the first sub-test signal line, the first insulating layer, and the second sub-connecting line are sequentially stacked along a direction away from the substrate, and the second sub-test signal line and the second sub-connecting line are disposed on a same layer; and
  the first insulating layer is provided with a first via hole thereon, and the first sub-test signal line is electrically connected to the second sub-test signal line through the first via hole.

In some embodiments, the cell test unit further includes an output signal line, wherein one end of the output signal line is electrically connected to the thin-film transistor, and the other end of the output signal line is electrically connected to the light-emitting device; and
  the output signal line includes a first output signal line and a second output signal line, wherein the first output signal line is electrically connected to the thin-film transistors disposed on a side, distal to a center of the display panel, of the second sub-connecting line, the second output signal line is electrically connected to the thin-film transistors disposed on a side, proximal to the center of the display panel, of the second sub-connecting line, and a line width of at least part of segments of the second output signal line is greater than a line width of the first output signal line.

In some embodiments, the second output signal line includes first sub-signal lines and second sub-signal lines electrically connected to the first sub-signal lines, wherein the second sub-signal lines are electrically connected to the thin-film transistors, a first included angle is formed between an extending direction of the first sub-signal lines and an extending direction of the second sub-signal lines, and the first included angle ranges from 90 degrees to 180 degrees; and
  a line width of at least part of segments of the second sub-signal lines is greater than the line width of the first output signal line.

In some embodiments, at least part of a plurality of second sub-signal lines include a first connecting segment and a first compensation segment electrically connected to the first connecting segment, and a line width of the first compensation segment is greater than a line width of the first connecting segment; and
  a length of each first compensation segment is positively correlated with a distance between the first compensation segment and the center of the display panel, and a length of each first connecting segment is negatively correlated with a distance between the first connecting segment and the center of the display panel.

In some embodiments, at least part of a plurality of second sub-signal lines include a first connecting segment and a first compensation segment electrically connected to the first connecting segment, and a line width of the first compensation segment is greater than a line width of the first connecting segment; and
  a plurality of first compensation segments are the same in length, and a width of each first compensation segment is positively correlated with a distance between the first compensation segment and the center of the display panel.

In some embodiments, part of the plurality of second sub-signal lines include a second connecting segment and a second compensation segment that are disposed on a side, proximal to the center of the display panel, of the first connecting segment and the first compensation segment; and
  the second compensation segment is S-shaped, and the second compensation segment becomes longer and longer along a direction close to the center of the display panel.

In some embodiments, the display panel further includes a bonding unit, wherein a ratio of a size of the bonding unit in the first direction to a size of the display region in the first direction is less than or equal to 0.5.

The display panel further includes a bonding unit, wherein a ratio of a size of the cell test unit in the first direction to a size of the bonding unit in the first direction is greater than or equal to 1.5.

In some embodiments, the display panel further includes a second insulating layer, wherein the first power line is disposed between the second insulating layer and the first insulating layer; and the display panel further includes a second power line, wherein the second power line is disposed in the non-display region and surrounds at least part of the display region, the second power line and the first power line are disposed on the same layer, and an orthographic projection of the second power line onto the substrate is overlapped with an orthographic projection of the second insulating layer onto the substrate.

In some embodiments, the second insulating layer covers an edge of the second power line.

In some embodiments, the second insulating layer includes a planarization layer.

In some embodiments, the display panel further includes a packaging layer disposed on a side, distal to the substrate, of the second power line.

In some embodiments, the first insulating layer, the second power line, and the packaging layer are stacked along a direction away from the substrate, the second power line further includes a plurality of second via holes, and the packaging layer is bonded to the first insulating layer through the second via holes.

In some embodiments, the display panel further includes a test pad disposed in the non-display region and a test line electrically connected to the test pad, wherein the test line is electrically connected to the cell test unit.

In some embodiments, the display panel further includes a bonding unit, wherein the bonding unit includes a control terminal, and the control terminal is electrically connected to the test signal line.

According to another aspect of the present disclosure, a display device is provided, wherein the display device includes a power supply assembly and the display panel described above; and the power supply assembly is connected to the display panel and configured to supply power to the display panel.

BRIEF DESCRIPTION OF THE DRAWINGS

For clearer descriptions of the technical solutions according to the embodiments of the present disclosure, the drawings required to be used in the description of the embodiments are briefly introduced below. It is obvious that the drawings in the description below are only some embodiments of the present disclosure, and it is obvious for those skilled in the art that other drawings can be obtained according to the drawings without creative efforts.

The above drawings have shown the explicit embodiments of the present disclosure, which will be described below in detail. These drawings and text descriptions are not intended to limit the scope of the conception of the present disclosure in any way, but to illustrate the concept of the present disclosure to those skilled in the art with reference to specific embodiments.

DETAILED DESCRIPTION

For clearer descriptions of the objects, technical solutions, and advantages of the present disclosure, the embodiments of the present disclosure are further described in detail below with reference to the drawings.

Figure 1:
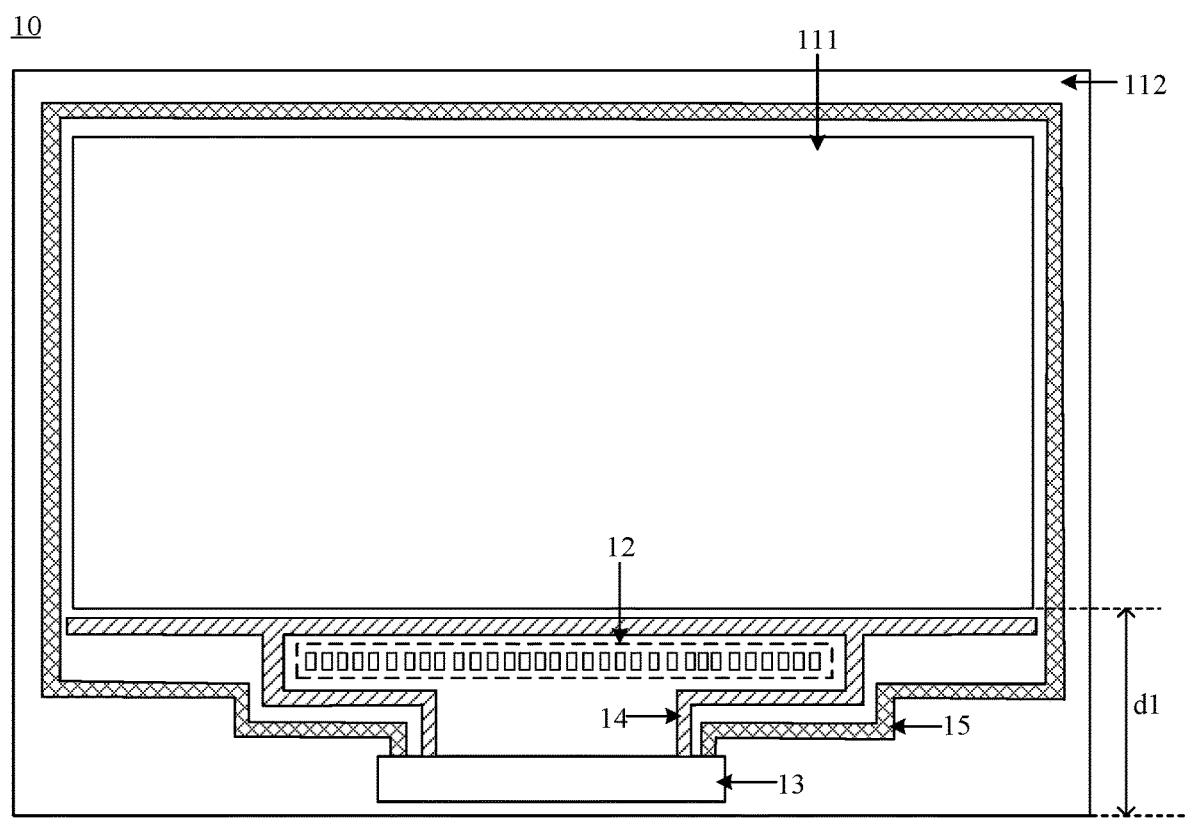
FIG. 1 is a schematic structural diagram of a display panel.

Referring to FIG. 1, FIG. 1 is a schematic structural diagram of a display panel. The display panel 10 includes a display region 111 and a non-display region 112 surrounding the display region 111. The display region 111 is provided a light-emitting device therein (not shown in FIG. 1). The display panel 10 further includes a cell test unit 12, a bonding unit 13, a first power line 14, and a second power line 15 which are disposed in the non-display region 112. The bonding unit 13 includes a plurality of bonding terminals configured to bond with an integrated circuit chip (IC chip). One end of each of the first power line 14 and the second power line 15 is electrically connected to the bonding terminal in the bonding unit 13, and the other end of each of the first power line and the second power line is electrically connected to the light-emitting device in the display region 111 to drive the light-emitting device in the display region 111.

The cell test unit 12 is configured to test the display panel for defective picture display in the manufacturing process thereof. Since the cell test unit 12 is disposed on a side, proximal to the display region 111, of the bonding unit 13, the first power line 14 needs to bypass the cell test unit 12 to extend to the edge of the display region 111. Meanwhile, the wiring space of the second power line 15 is affected by the wiring positions of the first power line 14, resulting in the wiring space of the second power line 15 being far away from the display region 111, and thus resulting in a large size of the non-display region 112 for arranging the first power line 14 and the second power line 15, thereby leading to a large size of the border of the display panel 10.

Moreover, since the first power line 14 bypasses the cell test unit 12 to extend to the edge of the display region 111, the length of the first power line 14 is long and the resistance on the first power line 14 is large, such that brightness of the light-emitting device in the display region 111 is affected, resulting in a poor display effect of the display panel 10.

Embodiments of the present disclosure provide a display panel and a display device, which can solve the problems in the related art described above.

Figure 2:
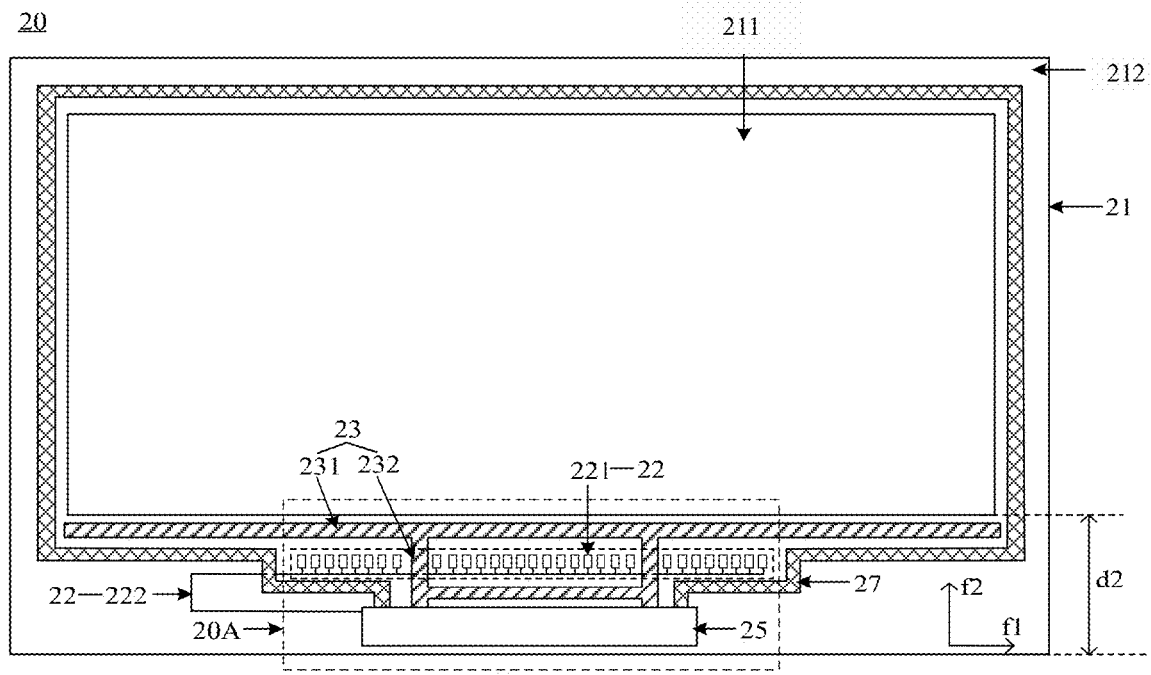
FIG. 2 is a schematic structural diagram of a display panel according to some embodiments of the present disclosure.

Referring to FIG. 2, FIG. 2 is a schematic structural diagram of a display panel according to some embodiments of the present disclosure. The display panel 20 includes a substrate 21, a light-emitting device (not shown in FIG. 2), a cell test unit 22, and a first power line 23.

The substrate 21 is provided with a display region 211 and a non-display region 212 disposed at a periphery of the display region 211. The light-emitting device is disposed in the display region 211, such that the display region 211 of the display panel 10 displays pictures.

The cell test unit 22 is disposed in the non-display region 212, and the cell test unit 22 includes a plurality of thin-film transistors 221 arranged along a first direction f1. The cell test unit 22 is disposed outside a first side s1 of the display region 212, and the cell test unit 22 is configured to be electrically connected to a test signal control element outside the display panel 20 for the defect test of the display panel 20. The first direction f1 is parallel to the first side s1.

The first power line 23 is disposed in the non-display region 212, and the first power line 23 includes a first sub-connecting line 231 and a second sub-connecting line 232. The first sub-connecting line 231 is disposed between the cell test unit 22 and the display region 211 and is electrically connected to the light-emitting device. One end of the second sub-connecting line 232 is electrically connected to the first sub-connecting line 231, the other end of the second sub-connecting line 232 is disposed on a side, distal to the display region 211, of the cell test unit 22, and the second sub-connecting line 232 is disposed between adjacent thin-film transistors 221 in the first direction f1.

An extending direction of the first sub-connecting line 231 is parallel to the first direction f1, and an extending direction of the second sub-connecting line 232 is perpendicular to the first direction f1, such that the routing layout of the first power line 23 can be structured. The other end of the second sub-connecting line 232 is electrically connected to the IC chip to supply power signals to the light-emitting device in the display region 211.

The second sub-connecting line 232 is disposed between adjacent thin-film transistors 221 in the first direction f1, and the second sub-connecting line 232 passes through the area where the cell test unit 22 is disposed to be electrically connected to the first sub-connecting line 231. That is, the first power line 23 passes through the area where the cell test unit is disposed to extend to the edge of the display region 211 of the display panel 20, such that the first power line 23 can be electrically connected to the light-emitting device in the display region 211. In this way, the first power line 23 does not need to extend to the edge of the display region 211 of the display panel 20 after bypassing the cell test unit 22, which can reduce the space occupied by the first power line 23 in the non-display region 212 of the display panel 20, thereby narrowing the border of the display panel 20. For example, as shown in FIG. 1 and FIG. 2, the width d2 of the lower border of the display panel 20 in the embodiments of the present disclosure is less than the width d1 of the lower border of the display panel 10 shown in FIG. 1.

Moreover, by setting the routing direction of the first power line 23 in this way, the length of the first power line 23 is short and thereby the resistance on the first power line 23 is small, such that the influence of the resistance of the first power line 23 on the brightness of the light-emitting device in the display region 111 can be reduced to improve the display effect of the display panel 10.

In summary, embodiments of the present disclosure provide a display panel. The display panel includes a substrate, a light-emitting device, a cell test unit, and a first power line. The cell test unit includes a plurality of thin-film transistors arranged along a first direction, and a second sub-connecting line in the first power line is disposed between adjacent thin-film transistors. That is, the first power line passes through the area where the cell test unit is disposed to extend to the outer edge of the display region of the display panel. In this way, the space occupied by the first power line in a non-display region of the display panel can be reduced, thereby narrowing the border of the display panel. The problem that a border of a display panel is relatively wide in the related art can be solved, and the effect of narrowing the border of the display panel can be achieved.

In addition, by reducing the winding length of the first power line, the whole length of the first power line is short, and the resistance on the first power line is small, such that the influence of the resistance of the first power line on the brightness of the light-emitting device in the display region can be reduced, which can improve the display effect of the display panel.

Figure 3:
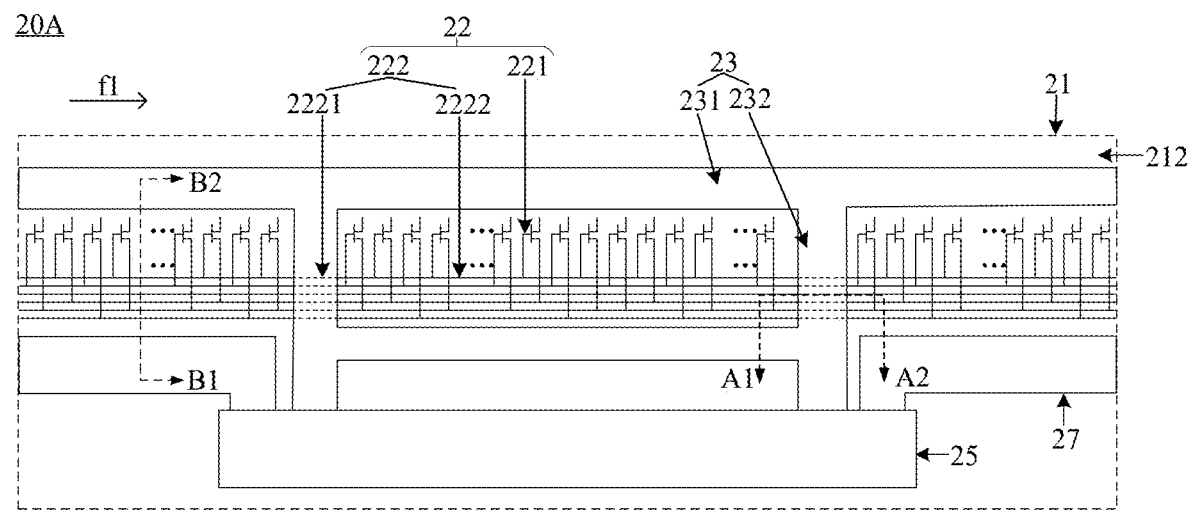
FIG. 3 is a schematic structural diagram of a part of the display panel shown in FIG. 2.
Figure 4:
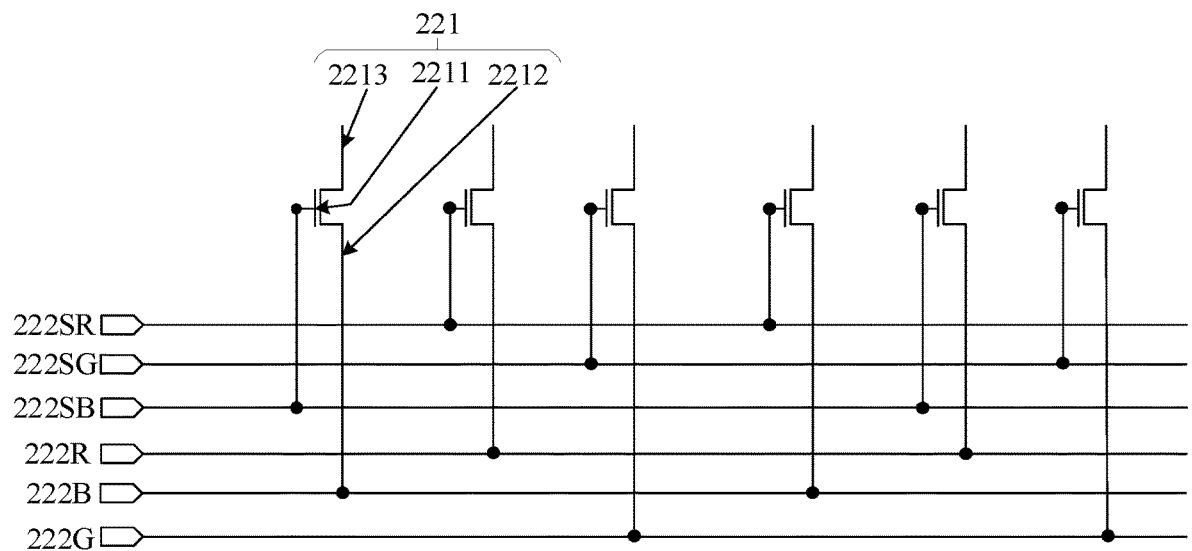
FIG. 4 is a schematic diagram of a circuit of a cell test unit according to some embodiments of the present disclosure.

In some embodiments, as shown in FIG. 3 and FIG. 4, FIG. 3 is a schematic structural diagram of part 20A of the display panel shown in FIG. 2, and FIG. 4 is a schematic diagram of a circuit of a cell test unit according to some embodiments of the present disclosure. The cell test unit 22 further includes test signal lines 222. The test signal lines 222 are electrically connected to the thin-film transistors 221, and the test signal lines 222 are configured to provide test signals to the thin-film transistors 221.

In the case that the colors of light emitted from the light-emitting device on the display panel 20 include three colors of red, green, and blue, the test signal line 222 includes a data red (DR) 222R, a data green (DG) 222G, a data blue (DB) 222B, a switch red (SWR) 222SR, a switch green (SWG) 222SG, and a switch blue (SWB) 222SB.

Each thin-film transistor 221 includes a control terminal 2211, a first terminal 2212, and a second terminal 2213, the control terminal 2211 is electrically connected to the switch red 222SR, the switch green 222SG, or the switch blue 222SB, and the control terminal 2211 is a gate of the thin-film transistor 221. The first terminal 2212 is electrically connected to the data red 222R, the data green 222G, or the data blue 222B to serve as an input terminal of the cell test unit 22, and the first terminal 2212 is a source or a drain of the thin-film transistor 221. The second terminal 2213 is electrically connected to the light-emitting device in the display region 211 to serve as an output terminal of the cell test unit 22, and the second terminal 2213 is a drain or a source of the thin-film transistor 221. It should be noted that the thin-film transistor 221 includes a low temperature poly-silicon (LTPS) thin-film transistor and/or an oxide thin-film transistor (O-TFT). The thin-film transistor 221 may further be other types of thin-film transistors, which is not limited in the embodiments of the present disclosure.

In the embodiments of the present disclosure, in the case that the thin-film transistors 221 having opposite polarities are used, or in the case that a current direction during circuit operation changes, the functions of the "source" and the "drain" described above may sometimes be interchanged. That is, in the embodiments of the present disclosure, "source" and "drain" may be interchanged with each other. This is not limited in the embodiments of the present disclosure.

The extending direction f1 of at least part of the segments of the test signal line 222 is intersected with the extending direction f2 of the second sub-connecting line 232. Further, the extending direction of at least part of segments of the test signal line 222 is parallel to the first direction f1. The control terminals 2211 of the plurality of thin-film transistors 221 in the cell test unit 22 is electrically connected to the same test signal line 222. Therefore, in the case that the second sub-connecting line 232 passes through the area where the cell test unit 22 is disposed, an orthographic projection of the test signal line 222 onto the substrate 21 is overlapped with an orthographic projection of the second sub-connecting line 232 onto the substrate 21. In this way, the thin-film transistors 221 disposed on two sides of the second sub-connecting line 232 do not need to be respectively provided with a test signal line; that is, the thin-film transistors 221 disposed on two sides of the second sub-connecting line 232 is controlled by the same test signal line 222, such that the routing design of the test signal line 222 of the cell test unit 22 can be simplified.

Figure 5:
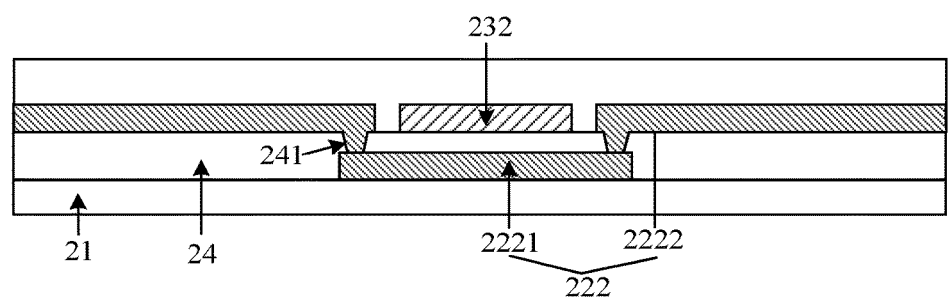
FIG. 5 is a schematic cross-sectional view of the display panel at A1-A2 shown in FIG. 3.

In some embodiments, FIG. 5 is a schematic cross-sectional view of the display panel at A1-A2 shown in FIG. 3. Referring to FIG. 3 and FIG. 5, the display panel 20 further includes a first insulating layer 24, and the test signal line 222 includes a first sub-test signal line 2221 and a second sub-test signal line 2222; the first sub-test signal line 2221, the first insulating layer 24, and the second sub-connecting line 232 are sequentially stacked along a direction away from the substrate 21, and the second sub-test signal line 2222 and the second sub-connecting line 232 are disposed on the same layer. The first insulating layer 24 is provided with a first via hole 241 thereon, and the first sub-test signal line 2221 is electrically connected to the second sub-test signal line 2222 through the first via hole 241. An orthographic projection of the first sub-test signal line 2221 onto the substrate 21 is overlapped with an orthographic projection of the second sub-connecting line 232 onto the substrate 21.

In this way, the test signal line 222 is set as the first sub-test signal line 2221 and the second sub-test signal line 2222 electrically connected across layers, such that the first sub-test signal line 2221 and the second sub-connecting line 232 are disposed on upper and lower sides, respectively, of the first insulating layer 24, which makes the second sub-connecting line 232 be insulated from the test signal line 222, thereby avoiding short circuit in the case that the second sub-connecting line 232 passes through the area where the test signal line 222 is disposed.

It should be noted that in FIG. 3, schematic patterns of the first power line 23 and the second power line 27 are not filled to clearly show the test signal line 222, and the first power line 23 and the second power line 27 in FIG. 3 are schematic structural diagrams of part of the first power line 23 and the second power line 27 in FIG. 2, and the structures are the same.

The display panel 20 further includes a source&drain (SD) metal pattern. The second sub-connecting line 232 and the second sub-test signal line 2222, and the source&drain metal pattern are disposed on the same layer. The display panel 20 further includes a gate metal pattern, and the first sub-test signal line 2221 and the gate metal pattern are disposed on the same layer.

Figure 6:
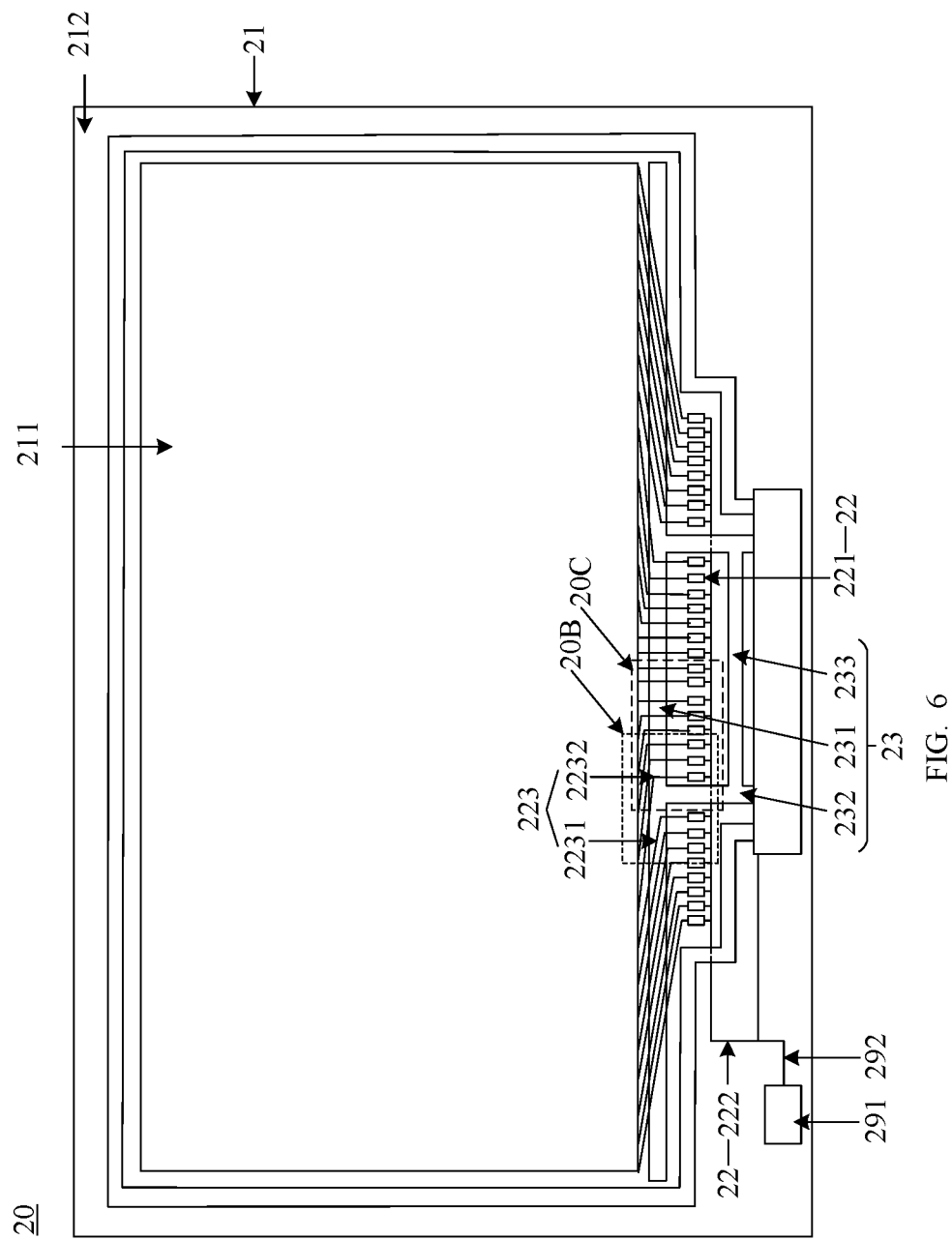
FIG. 6 is a schematic structural diagram of another display panel according to some embodiments of the present disclosure.

In some embodiments, as shown in FIG. 6, FIG. 6 is a schematic structural diagram of another display panel according to some embodiment of the present disclosure. The cell test unit 22 further includes output signal lines 223. One end of each output signal line 223 is electrically connected to the thin-film transistor 221, and the other end of the output signal line 223 is electrically connected to the light-emitting device. The output signal lines 223 and the gate metal pattern are disposed on the same layer.

It should be noted that, in FIG. 6, in order to more completely show the shape of the output signal lines 223, the schematic diagram of the output signal lines 223 is disposed on an upper layer of the first power line 23, and in the structure of the actual display panel 20, the output signal line 223 is disposed on a side, proximal to the substrate 21, of the first power line 23; that is, the output signal line 223 is disposed on a lower layer of the first power line 23. Moreover, in FIG. 6, the schematic patterns of the first power line 23 and the second power line 27 are not filled to clearly show the lines overlapped with the first power line 23 and the second power line 27.

Each output signal line 223 includes first output signal lines 2231 and second output signal lines 2232, and the first output signal line 2231 and the second output signal line 2232 are electrically connected to the thin-film transistors 221 disposed on two sides of the second sub-connecting line 232, respectively.

The first output signal line 2231 is electrically connected to the thin-film transistors 221 disposed on a side, distal to the center of the display panel 20, of the second sub-connecting line 232, and the second output signal line 2232 is electrically connected to the thin-film transistors 221 disposed on a side, proximal to the center of the display panel 20, of the second sub-connecting line 232. Moreover, a line width of at least part of segments of the second output signal line 2232 is greater than a line width of the first output signal line 2231.

The output signal line 223 extends to the outer edge of the display region 211 in a fan-out lead mode and is electrically connected to the light-emitting device in the display region 211. A plurality of output signal lines 223 extending in the fan-out lead mode have different starting ends and extend to different positions in the display region 211, such that the plurality of output signal lines 223 are different in length, and the length differences between adjacent output signal lines 223 are relatively close along an arrangement direction of the plurality of output signal lines 223.

The second sub-connecting line 232 of the first power line 23 is disposed between adjacent thin-film transistors 221, such that a distance between adjacent thin-film transistors 221 disposed on two sides of the second sub-connecting line 232, respectively, is greater than a distance between two adjacent thin-film transistors 221 disposed on the same side of the second sub-connecting line 232. That is, the first power line 23 results in a relatively great difference in the length of the first output signal line 2231 and the second output signal line 2232 electrically connected to the thin-film transistors 221 disposed on two sides, respectively, of the second sub-connecting line 232. Therefore, a line width of the second output signal line 2232 is increased to allow the difference in the resistance between the plurality of output signal lines 223 to be relatively small, such that the resistance values of the plurality of output signal lines 223 are in a smoothly varying state.

In an optional embodiment, the first power line 23 includes two second sub-connecting lines 232 and further includes a third sub-connecting line 233. Two ends of the third sub-connecting line 233 are electrically connected to the two second sub-connecting lines 232, respectively, such that the stability of the electric connection between the first power line 23 and the bonding unit 25 can be enhanced.

Figure 7:
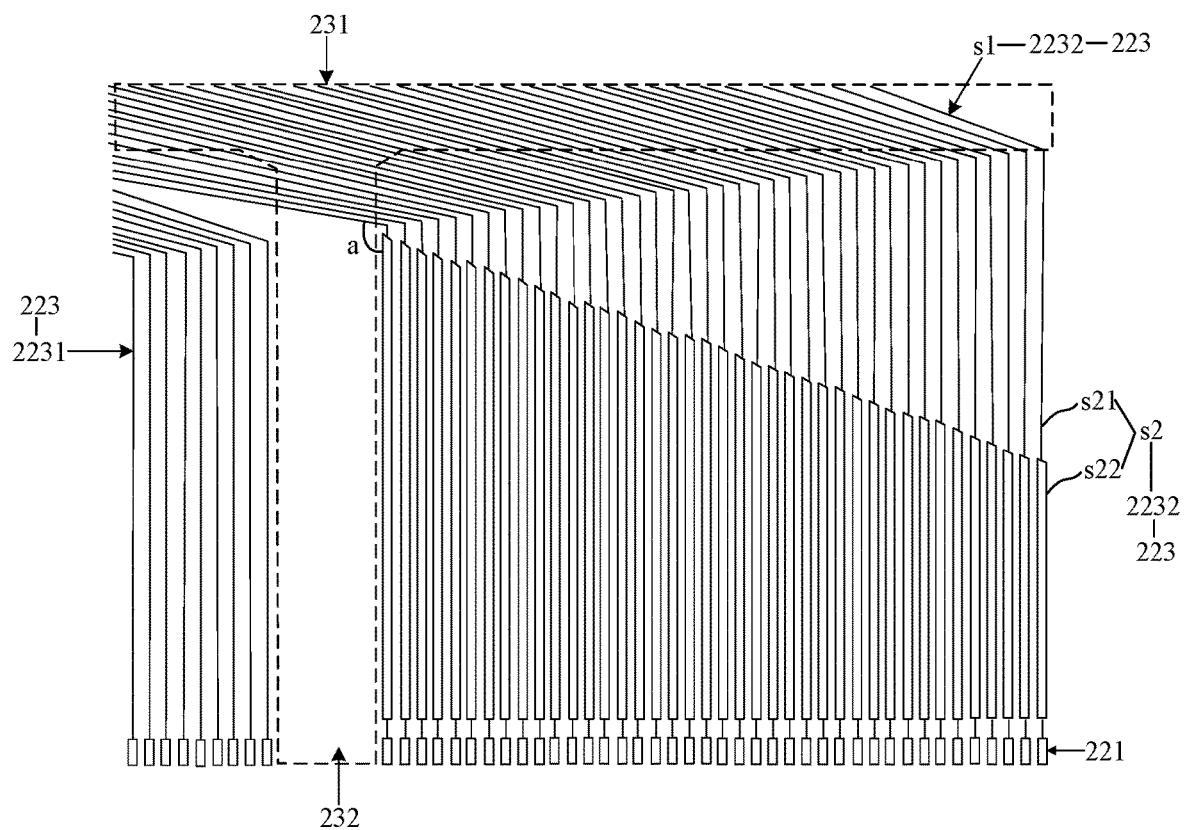
FIG. 7 is a schematic structural diagram of a part of the display panel shown in FIG. 6.

In some embodiments, as shown in FIG. 7, FIG. 7 is a schematic structural diagram of part 20B of the display panel shown in FIG. 6. Each second output signal line 2232 includes a first sub-signal line s1 and a second sub-signal line s2 electrically connected to the first sub-signal line s1. The second sub-signal line s2 is electrically connected to the thin-film transistors 221, a first included angle a is formed between an extending direction of the first sub-signal line s1 and an extending direction of the second sub-signal line s2, and the first included angle a ranges from 90 degrees to 180 degrees. The extending direction of the second sub-signal line s2 is parallel to the second direction f2; that is, the second sub-signal line s2 is vertically routed, and the first sub-signal line s1 is obliquely routed. A line width of at least part of segments of the second sub-signal line s2 is greater than a line width of the first output signal line 2231.

The wiring density of the first sub-signal lines s1 in the second output signal lines 2232 wired in the fan-out lead mode is greater than the wiring density of the second sub-signal lines s2. That is, the spacing between any adjacent first sub-signal lines s1 is greater than that between any adjacent second sub-signal lines s2. Therefore, the width of the second sub-signal line s2 can be enlarged to reduce the resistance value of the second output signal line 2232, such that the difference in resistance value between the first output signal line 2231 and the second output signal line 2232 is relatively small.

In some embodiments, as shown in FIG. 7, at least part of a plurality of second sub-signal lines s2 includes a first connecting segment s21 and a first compensation segment s22 electrically connected to the first connecting segment s21, and a line width of the first compensation segment s22 is greater than a line width of the first connecting segment s21.

A length of each first compensation segment s22 is positively correlated with a distance between the first compensation segment s22 and the center of the display panel 20, and a length of each first connecting segment s21 is negatively correlated with a distance between the first connecting segment s21 and the center of the display panel 20. The plurality of second sub-signal lines s2 gradually become shorter along a direction close to the center of the display panel 20 and thereby the resistance thereof also gradually becomes smaller, and thus the plurality of first compensation segments s22 become shorter and shorter along the direction close to the center of the display panel 20, and the plurality of first connecting segments s21 become longer and longer along the direction close to the center of the display panel 20, such that the resistance values of the plurality of output signal lines 223 reach a smoothly varying state.

It should be noted that in FIG. 7, the first sub-connecting line 231 and the second sub-connecting line 232 in the first power line 23 are indicated by a dashed box to clearly show the shape of the second output signal lines 2232.

Figure 8:
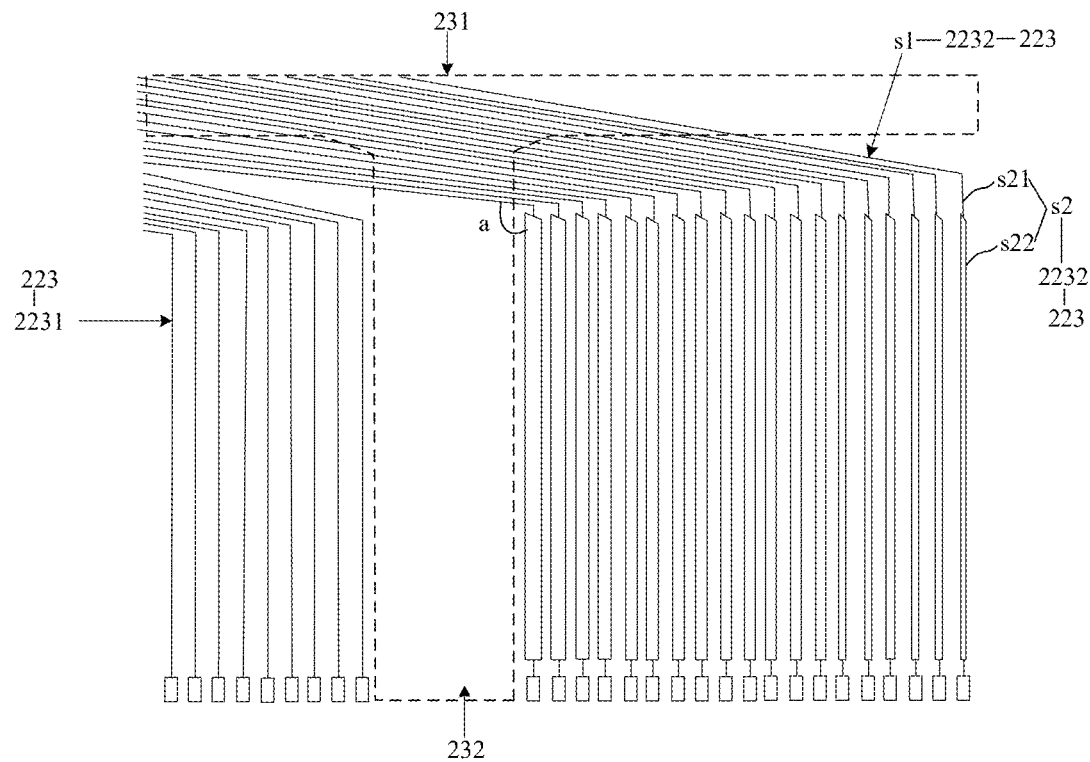
FIG. 8 is a schematic structural diagram of a second output signal line according to some embodiments of the present disclosure.

In some embodiments, as shown in FIG. 8, FIG. 8 is a schematic structural diagram of a second output signal line according to some embodiments of the present disclosure. The second output signal lines shown in FIG. 8 are disposed at the part 20B of the display panel shown in FIG. 6. At least part of a plurality of second sub-signal lines s2 includes a first connecting segment s21 and a first compensation segment s22 electrically connected to the first connecting segment s21, and a line width of the first compensation segment s22 is greater than a line width of the first connecting segment s21.

A plurality of first compensation segments s22 are the same in length, and a width of each first compensation segment s22 is positively correlated with a distance between the first compensation segment s22 and the center of the display panel 20. The plurality of second sub-signal lines s2 gradually become shorter along a direction close to the center of the display panel 20 and thereby the resistance thereof also gradually becomes smaller, and thus the plurality of first compensation segments s22 become narrower and narrower along the direction close to the center of the display panel 20, such that the resistance values of the plurality of output signal lines 223 reach a smoothly varying state.

Figure 9:
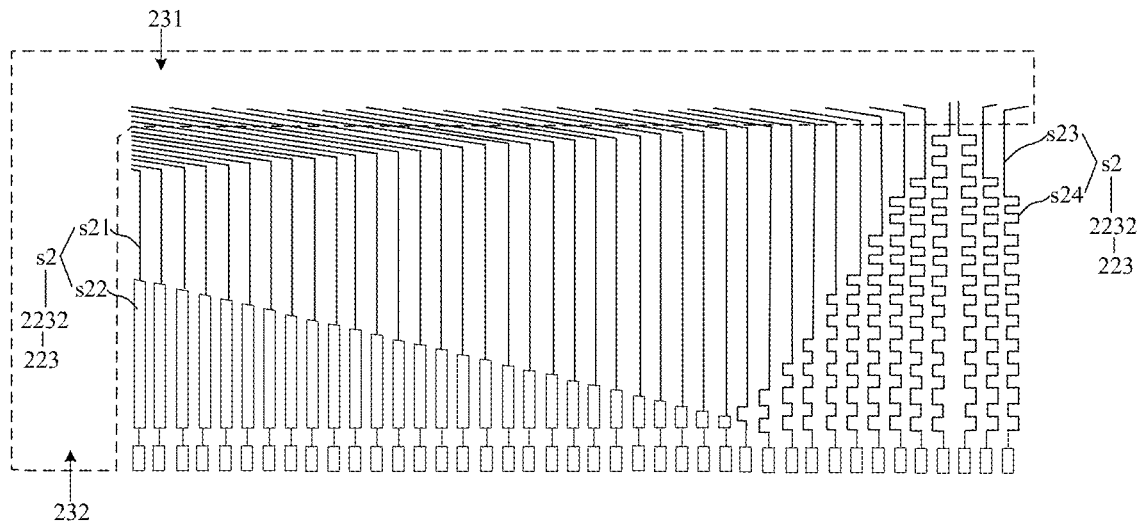
FIG. 9 is a schematic structural diagram of a part of the display panel shown in FIG. 6.

In some embodiments, as shown in FIG. 9, FIG. 9 is a schematic structural diagram of part 20C of the display panel shown in FIG. 6. Part of the plurality of second sub-signal lines s2 includes a second connecting segment s23 and a second compensation segment s24, and the second connecting segment s23 and the second compensation segment s24 are disposed on a side, proximal to the center of the display panel 20, of the first connecting segment s21 and the first compensation segment s22. The plurality of second sub-signal lines s2 gradually become shorter along the direction close to the center of the display panel 20 and thereby the resistance thereof also gradually becomes smaller, and thus the second sub-signal line s2 disposed at the center of the display panel 20 is the shortest, and the center is a position where the symmetry axis of the display panel 20 is disposed. Therefore, the resistance values of part of the second sub-signal lines s2 are increased in the case that a smoothly varying state of the resistance values of a plurality of output signal lines 223 is ensured, so as to avoid a great difference in the resistance of the plurality of second sub-signal lines s2. The second compensation segment s24 is S-shaped, and a length of the second compensation segment s24 becomes longer and longer along the direction close to the center of the display panel 20. That is, the shorter the second sub-signal line s2, the longer the second compensation segment s24. The length of the second compensation segment s24 refers to the actual length of the S-shaped second compensation segment s24.

In some embodiments, as shown in FIG. 2, the display panel 20 further includes a bonding unit 25. The bonding unit 25 includes a power terminal electrically connected to the first power line 23, and a ratio of a size of the bonding unit 25 in the first direction f1 to a size of the display region 211 in the first direction f1 is less than or equal to 0.5. In the case that the size of the bonding unit 25 is smaller relative to the size of the display region 211, a wiring mode in which the first power line 23 passes through the area where the cell test unit 22 is disposed may be used.

In some embodiments, a ratio of the size of the cell test unit 22 in the first direction f1 to the size of the bonding unit 25 in the first direction is greater than or equal to 1.5. In this way, in the case that the size of the cell test unit 22 is greater relative to the size of the bonding unit 25, the length of the first power line 23 will be relatively long if the first power line 23 bypasses the cell test unit 22 to extend to the edge of the display region 211. In the embodiments of the present disclosure, the length of the first power line 23 is short and the resistance on the first power line 23 is small by using a wiring mode in which the first power line 23 passes through the area where the cell test unit 22 is disposed, such that the influence of the resistance of the first power line 23 on the brightness of the light-emitting device in the display region 111 can be reduced, thereby improving the display effect of the display panel 10.

Figure 10:
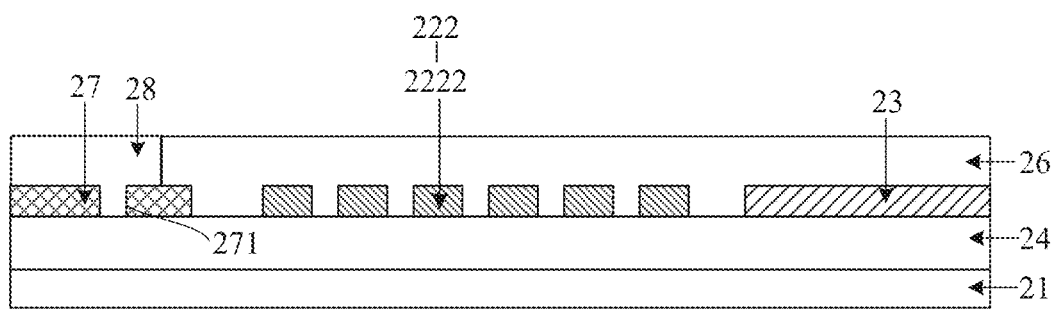
FIG. 10 is a schematic cross-sectional view of the display panel at B1-B2 shown in FIG. 3.

In some embodiments, as shown in FIG. 10, FIG. 10 is a schematic cross-sectional view of the display panel at B1-B2 shown in FIG. 3. The display panel 20 further includes a second insulating layer 26, and the first power line 23 is disposed between the second insulating layer 26 and the first insulating layer 24. The display panel 20 further includes a second power line 27. The second power line 27 is disposed in the non-display region 212 and surrounds at least part of the display region 211, the second power line 27 and the first power line 23 are disposed on the same layer, and an orthographic projection of the second power line 27 onto the substrate 21 is overlapped with an orthographic projection of the second insulating layer 26 onto the substrate 21. Thus, the second insulating layer 26 is configured to protect the second power line 27. The display panel 20 further includes an electro-static discharge (ESD) unit and a clock signal line. The electro-static discharge unit and the clock signal line are disposed between the second power line 27 and the first power line 23, and the second insulating layer 26 is configured to protect the second power line 27, the electro-static discharge unit, and the clock signal line. In the embodiments of the present disclosure, the first power line 23 is a driving power line VDD, and the second power line 27 is a pull-down power line VSS.

In some embodiments, as shown in FIG. 10, the second insulating layer 26 covers an edge of the second power line 27. The edge is an edge, proximal to the display region 211, of the second power line 27, and thus the second insulating layer 26 prevents the edge of the second power line 27 from being corroded. Moreover, the influence of the second insulating layer on the packaging effect of the packaging layer described below can be avoided.

In some embodiments, the second insulating layer 26 includes a planarization (PLN) layer. A material of the planarization layer includes an organic insulating material. For example, the material of the planarization layer includes at least one of acrylic fiber, hexamethyldisiloxane, and polystyrene.

In some embodiments, as shown in FIG. 10, the display panel 20 further includes a packaging layer 28 on a side, distal to the substrate 21, of the second power line 27. The light-emitting device in the display panel 20 is isolated from the external environment through packaging so as to prevent moisture, oxygen, dust, and the like from damaging the light-emitting device, thereby prolonging the service life of the light-emitting device. The packaging layer 28 is further configured to protect the second power line 27. A material of the packaging layer is frit.

In some embodiments, the first insulating layer 24, the second power line 27, and the packaging layer 28 are disposed on one side of the substrate 21 and are stacked along a direction away from the substrate 21. A material of the first insulating layer 24 is an inorganic insulating material. For example, the material of the first insulating layer 24 is silicon oxide or silicon nitride. The second power supply 27 further includes a plurality of second via holes 271, and the packaging layer 28 is bonded to the first insulating layer 24 through the second via holes 271, such that the connection between the packaging layer 28 and other film layers on the display panel 20 can be relatively firm, thereby improving the packaging effect of the display panel 20.

In some embodiments, as shown in FIG. 6, the display panel 20 further includes a test pad 291 disposed in the non-display region 212 and a test line 292 electrically connected to the test pad, and the test line 292 is electrically connected to the cell test unit 22. The test pad 291 is disposed on a side, proximal to an edge of the display panel, of the second power line 27. The test pad 291 is configured to receive an electric test signal. The test line 292 is configured to transmit the electrical test signal to the cell test unit 22, such that the thin-film transistors 221 in the cell test unit 22 are in an on state.

In some embodiments, the bonding unit 25 further includes a control terminal, and the control terminal is electrically connected to the test signal line 222. The control terminal is configured to receive a control signal and transmit the control signal to the cell test unit. The bonding unit 25 is electrically connected to the IC chip to acquire a driving signal of the display panel 20. The thin-film transistors 221 in the cell test unit 22 receives the control signal output by the control terminal and is in an off state, such that the influence of the cell test unit 22 on the starting of the light-emitting device in the display panel 20 during the normal use of the display panel 20 can be avoided.

In summary, embodiments of the present disclosure provide a display panel. The display panel includes a substrate, a light-emitting device, a cell test unit, and a first power line. The cell test unit includes a plurality of thin-film transistors arranged along a first direction, and a second sub-connecting line in the first power line is disposed between adjacent thin-film transistors. That is, the first power line passes through the area where the cell test unit is disposed to extend to the outer edge of the display region of the display panel. In this way, the space occupied by the first power line in a non-display region of the display panel can be reduced, thereby narrowing the border of the display panel. The problem that a border of a display panel is relatively wide in the related art can be solved, and the effect of narrowing the border of the display panel can be achieved.

In addition, by reducing the winding length of the first power line, the whole length of the first power line is short, and the resistance on the first power line is small, such that the influence of the resistance of the first power line on the brightness of the light-emitting device in the display region can be reduced, which can improve the display effect of the display panel.

Embodiments of the present disclosure further provide a display device. The display device includes a power supply assembly and the display panel of any one of the above embodiments. The power supply assembly is connected to the display panel and configured to supply power to the display panel.

In some embodiments, the display device is any product or component with a display function, such as an AMOLED display device, a liquid crystal display device, electronic paper, a mobile phone, a tablet computer, a television, a display, a notebook computer, and a digital photo frame.

In the present disclosure, the term "at least one of A and B" merely describes the association relationship of the associated objects and indicates that three relationships may be present. For example, at least one of A and B may indicate that: only A is present, both A and B exist are present, and only B is present. Similarly, "at least one of A, B, and C" indicates that seven relationships may be present and may indicate that: only A is present, only B is present, only C is present, both A and B are present, both A and C are present, both C and B are present, and A, B, and C are all present. Similarly, "at least one of A, B, C, and D" indicates that fifteen relationships may be present and may indicate that: only A is present, only B is present, only C is present, only D is present, both A and B are present, both A and C are present, both A and D are present, both C and B are present, both D and B are present, both C and D are present, A, B, and C are all present, A, B, and D are all present, A, C, and D are all present, B, C, and D are all present, and A, B, C, and D are all present.

It should be noted that, in the drawings, the sizes of the layers and areas may be exaggerated for clarity of illustration. Also, it can be understood that, in the case that an element or layer is referred to as being "on" another element or layer, it may be directly on the other element, or an intermediate layer may be present. In addition, it can be understood that, in the case that an element or layer is referred to as being "under" another element or layer, it may be directly under the other element, or one or more intermediate layers or elements may be present. In addition, it can also be understood that, in the case that a layer or element is referred to as being "between" two layers or elements, it may be the only layer between the two layers or elements, or one or more intermediate layers or elements may also be present. Like reference numerals refer to like elements throughout the present disclosure.

In the present disclosure, the terms "first", "second", "third", and "fourth" are merely used for descriptive purposes and should not be construed as indicating or implying relative importance. The term "a plurality of" refers to two or more, unless otherwise explicitly defined.

Described above are merely optional embodiments of the present disclosure and are not intended to limit the present disclosure. Any modifications, equivalents, improvements, and the like, made within the spirit and principle of the present disclosure should fall within the protection scope of the present disclosure.

The invention claimed is:

1. A display panel, comprising:
   a substrate provided with a display region and a non-display region disposed at a periphery of the display region;
   a light-emitting device disposed in the display region;
   a cell test unit disposed in the non-display region, wherein the cell test unit comprises a plurality of thin-film transistors arranged along a first direction;
   a first power line disposed in the non-display region, wherein the first power line comprises a first sub-connecting line and a second sub-connecting line, the first sub-connecting line is disposed between the cell test unit and the display region and is electrically connected to the light-emitting device, one end of the second sub-connecting line is electrically connected to the first sub-connecting line, and the other end of the second sub-connecting line is disposed on a side, distal to the display region, of the cell test unit, and the second sub-connecting line is disposed between adjacent thin-film transistors in the first direction.

2. The display panel according to claim 1, wherein the cell test unit further comprises a test signal line, the test signal line is electrically connected to the thin-film transistors and is configured to provide a test signal to the thin-film transistors; and
   an orthographic projection of the test signal line onto the substrate is overlapped with an orthographic projection of the second sub-connecting line onto the substrate.

3. The display panel according to claim 2, further comprising a first insulating layer, wherein the test signal line comprises a first sub-test signal line and a second sub-test signal line, the first sub-test signal line, the first insulating layer, and the second sub-connecting line are sequentially stacked along a direction away from the substrate, and the second sub-test signal line and the second sub-connecting line are disposed on a same layer; and
   the first insulating layer is provided with a first via hole thereon, and the first sub-test signal line is electrically connected to the second sub-test signal line through the first via hole.

4. The display panel according to claim 1, wherein the cell test unit further comprises an output signal line, wherein one end of the output signal line is electrically connected to the thin-film transistor, and the other end of the output signal line is electrically connected to the light-emitting device; and
   the output signal line comprises a first output signal line and a second output signal line, wherein the first output signal line is electrically connected to the thin-film transistors disposed on a side, distal to a center of the display panel, of the second sub-connecting line, the second output signal line is electrically connected to the thin-film transistors disposed on a side, proximal to the center of the display panel, of the second sub-connecting line, and a line width of at least part of segments of the second output signal line is greater than a line width of the first output signal line.

5. The display panel according to claim 4, wherein the second output signal line comprises first sub-signal lines and second sub-signal lines electrically connected to the first sub-signal lines, wherein the second sub-signal lines are electrically connected to the thin-film transistors, a first included angle is formed between an extending direction of the first sub-signal lines and an extending direction of the second sub-signal lines, and the first included angle ranges from 90 degrees to 180 degrees; and
   a line width of at least part of segments of the second sub-signal lines is greater than the line width of the first output signal line.

6. The display panel according to claim 5, wherein at least part of a plurality of second sub-signal lines comprise a first connecting segment and a first compensation segment electrically connected to the first connecting segment, and a line width of the first compensation segment is greater than a line width of the first connecting segment; and
   a length of each first compensation segment is positively correlated with a distance between the first compensation segment and the center of the display panel, and a length of each first connecting segment is negatively correlated with a distance between the first connecting segment and the center of the display panel.

7. The display panel according to claim 5, wherein at least part of a plurality of second sub-signal lines comprise a first connecting segment and a first compensation segment electrically connected to the first connecting segment, and a line width of the first compensation segment is greater than a line width of the first connecting segment; and
   a plurality of first compensation segments are the same in length, and a width of each first compensation segment is positively correlated with a distance between the first compensation segment and the center of the display panel.

8. The display panel according to claim 6, wherein part of the plurality of second sub-signal lines comprise a second connecting segment and a second compensation segment that are disposed on a side, proximal to the center of the display panel, of the first connecting segment and the first compensation segment; and
   the second compensation segment is S-shaped, and the second compensation segment becomes longer and longer along a direction close to the center of the display panel.

9. The display panel according to claim 1, further comprising a bonding unit, wherein a ratio of a size of the bonding unit in the first direction to a size of the display region in the first direction is less than or equal to 0.5.

10. The display panel according to claim 1, further comprising a bonding unit, wherein a ratio of a size of the cell test unit in the first direction to a size of the bonding unit in the first direction is greater than or equal to 1.5.

11. The display panel according to claim 3, further comprising a second insulating layer, wherein the first power line is disposed between the second insulating layer and the first insulating layer; and the display panel further comprises a second power line, wherein the second power line is disposed in the non-display region and surrounds at least part of the display region, the second power line and the first power line are disposed on a same layer, and an orthographic projection of the second power line onto the substrate is overlapped with an orthographic projection of the second insulating layer onto the substrate.

12. The display panel according to claim 11, wherein the second insulating layer covers an edge of the second power line.

13. The display panel according to claim 11, wherein the second insulating layer comprises a planarization layer.

14. The display panel according to claim 11, further comprising a packaging layer disposed on a side, distal to the substrate, of the second power line.

15. The display panel according to claim 14, wherein the first insulating layer, the second power line, and the packaging layer are stacked along a direction away from the substrate, the second power line further comprises a plurality of second via holes, and the packaging layer is bonded to the first insulating layer through the second via holes.

16. The display panel according to claim 1, further comprising a test pad disposed in the non-display region and a test line electrically connected to the test pad, wherein the test line is electrically connected to the cell test unit.

17. The display panel according to claim 2, further comprising a bonding unit, wherein the bonding unit comprises a control terminal electrically connected to the test signal line.

18. A display device, comprising: a power supply assembly and a display panel, wherein the display panel comprises:

a substrate provided with a display region and a non-display region disposed at a periphery of the display region;

a light-emitting device disposed in the display region;

a cell test unit disposed in the non-display region, wherein the cell test unit comprises a plurality of thin-film transistors arranged along a first direction;

a first power line disposed in the non-display region, wherein the first power line comprises a first sub-connecting line and a second sub-connecting line, the first sub-connecting line is disposed between the cell test unit and the display region and is electrically connected to the light-emitting device, one end of the second sub-connecting line is electrically connected to the first sub-connecting line, and the other end of the second sub-connecting line is disposed on a side, distal to the display region, of the cell test unit, and the second sub-connecting line is disposed between adjacent thin-film transistors in the first direction;

and the power supply assembly is connected to the display panel and configured to supply power to the display panel.

19. The display device according to claim 18, wherein the cell test unit further comprises a test signal line, the test signal line is electrically connected to the thin-film transistors and is configured to provide a test signal to the thin-film transistors; and an orthographic projection of the test signal line onto the substrate is overlapped with an orthographic projection of the second sub-connecting line onto the substrate.

20. The display device according to claim 18, wherein the cell test unit further comprises an output signal line, wherein one end of the output signal line is electrically connected to the thin-film transistor, and the other end of the output signal line is electrically connected to the light-emitting device; and the output signal line comprises a first output signal line and a second output signal line, wherein the first output signal line is electrically connected to the thin-film transistors disposed on a side, distal to a center of the display panel, of the second sub-connecting line, the second output signal line is electrically connected to the thin-film transistors disposed on a side, proximal to the center of the display panel, of the second sub-connecting line, and a line width of at least part of segments of the second output signal line is greater than a line width of the first output signal line.

* * * * *